United States Patent
Kratz et al.

(10) Patent No.: US 11,615,279 B1
(45) Date of Patent: *Mar. 28, 2023

(54) RADIO-FREQUENCY SYSTEM CHARACTERIZED BY FLAT GROUP DELAY FOR RADIO-FREQUENCY TIME SYNCHRONIZATION AND RANGING

(71) Applicant: ZaiNar, Inc., Redwood City, CA (US)

(72) Inventors: Philip Kratz, Redwood City, CA (US); Mainak Chowdhury, Redwood City, CA (US)

(73) Assignee: ZaiNar, Inc., Redwood City, CA (US)

( * ) Notice: Subject to any disclaimer, the term of this patent is extended or adjusted under 35 U.S.C. 154(b) by 213 days.

This patent is subject to a terminal disclaimer.

(21) Appl. No.: 16/862,080

(22) Filed: Apr. 29, 2020

Related U.S. Application Data

(60) Provisional application No. 62/840,341, filed on Apr. 29, 2019.

(51) Int. Cl.
G06K 19/00 (2006.01)
H03H 7/40 (2006.01)

(52) U.S. Cl.
CPC .............. *G06K 19/00* (2013.01); *H03H 7/40* (2013.01)

(58) Field of Classification Search
CPC .................................. G06K 19/00; H03H 7/40
See application file for complete search history.

(56) References Cited

U.S. PATENT DOCUMENTS

| | | | |
|---|---|---|---|
| 10,903,866 B1 * | 1/2021 | Kratz | H04L 7/0079 |
| 10,903,915 B1 * | 1/2021 | Kratz | H04B 1/16 |
| 2006/0215583 A1 | 9/2006 | Castagnoli | |
| 2013/0322426 A1 | 12/2013 | Niranjayan et al. | |
| 2015/0295702 A1 | 10/2015 | Ogawa | |
| 2016/0099700 A1 * | 4/2016 | Tavakol | H03H 7/48 343/861 |
| 2021/0006389 A1 | 1/2021 | Kratz et al. | |

(Continued)

OTHER PUBLICATIONS

Booker, H.G. Slot Aerials and their Relation to Complementary Wire Aerials (Babinet's Principle). Cavendish Laboratory. Cambridge (1946).

(Continued)

*Primary Examiner* — Minh D A
(74) *Attorney, Agent, or Firm* — Run8 Patent Group, LLC; Peter Miller

(57) ABSTRACT

A radio-frequency system including: a self-complementary antenna characterized by an input impedance substantially independent of signal frequency across an operational frequency band; a passive coupling device characterized by a characteristic impedance and configured to couple the self-complementary antenna to a signal generator and a set of signal processors; a resistive matching network electrically connected between the self-complementary antenna and the passive coupling device configured to match the characteristic impedance of the passive coupling device to the input impedance of the self-complementary antenna; and a back-coupling line characterized by a substantially constant group delay across the operational frequency band configured to electromagnetically couple the signal generator to the set of signal processors.

20 Claims, 7 Drawing Sheets

(56) References Cited

U.S. PATENT DOCUMENTS

2021/0243713 A1    8/2021   Ellenbeck et al.

OTHER PUBLICATIONS

Deschamps, Georges A.. "Impedance Properties of Complementary Multiterminal Planar Structures". IRE Transactions on Antennas and Propagation. (Dec. 1959).
Mushiake, Yasuto. "Self-Complimentary Antennas". vol. 34, No. 6, IEEE Antennas and Propagation Magazine. (Dec. 1992).
International Search Report and Written Opinion from International Application No. PCT/US22/25828, 10 pages.
Non-Final Office Action for U.S. Appl. No. 17/338,543 dated May 12, 2022.

\* cited by examiner

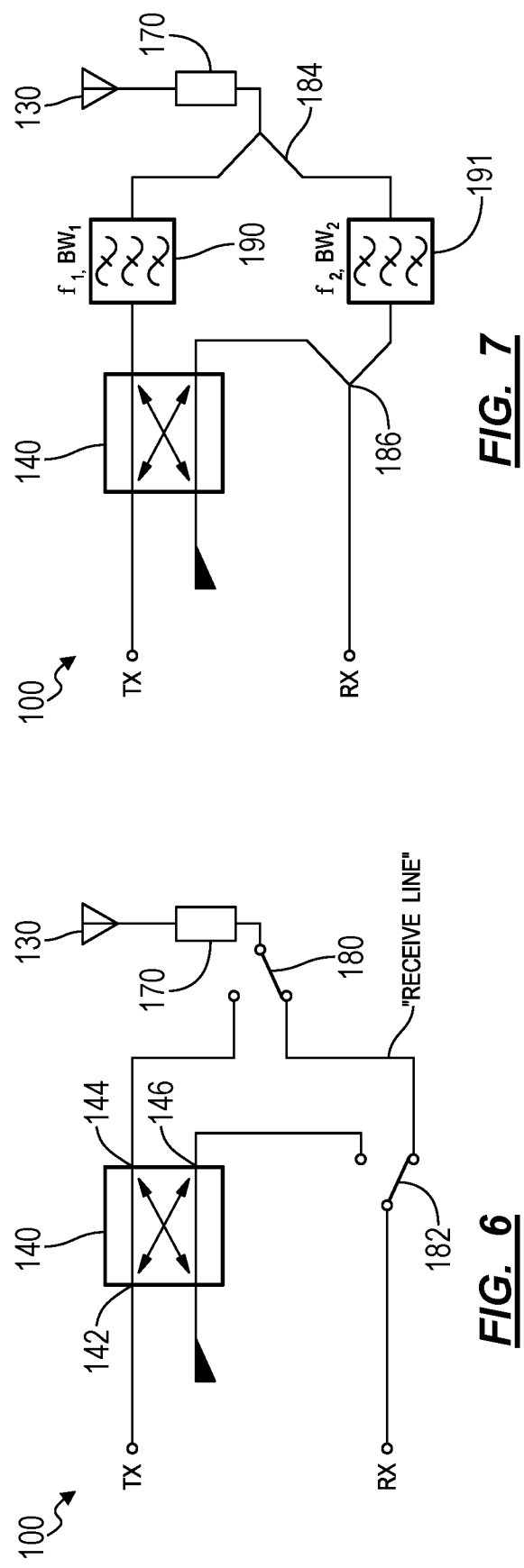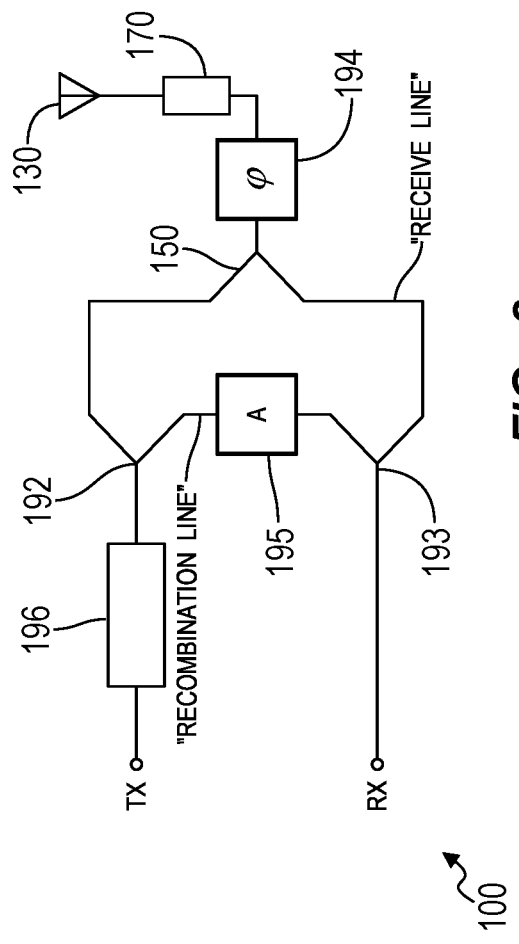

US 11,615,279 B1

RADIO-FREQUENCY SYSTEM CHARACTERIZED BY FLAT GROUP DELAY FOR RADIO-FREQUENCY TIME SYNCHRONIZATION AND RANGING

CROSS-REFERENCE TO RELATED APPLICATIONS

This Application claims the benefit of U.S. Provisional Application No. 62/840,341, filed on 29 Apr. 2019, which is incorporated in its entirety by this reference.

This Application is related to U.S. patent application Ser. No. 16/719,532, filed on 18 Dec. 2019, U.S. patent application Ser. No. 16/719,545, filed on 18 Dec. 2019, and U.S. patent application Ser. No. 16/405,922, filed on 7 May 2019, which are all incorporated in their entireties by this reference.

TECHNICAL FIELD

This invention relates generally to the field of radio-frequency signal reception and more specifically to a new and useful radio-frequency system characterized by flat group delay for radio-frequency time synchronization and ranging in the field of radio-frequency signal reception.

BRIEF DESCRIPTION OF THE FIGURES

FIG. 6 is a schematic representation of one variation of the radio-frequency system;

FIG. 7 is a schematic representation of one variation of the radio-frequency system;

FIG. 8 is a schematic representation of one variation of the radio-frequency system;

DESCRIPTION OF THE EMBODIMENTS

The following description of embodiments of the invention is not intended to limit the invention to these embodiments but rather to enable a person skilled in the art to make and use this invention. Variations, configurations, implementations, example implementations, and examples described herein are optional and are not exclusive to the variations, configurations, implementations, example implementations, and examples they describe. The invention described herein can include any and all permutations of these variations, configurations, implementations, example implementations, and examples.

1. Radio-Frequency System

Figure 1:
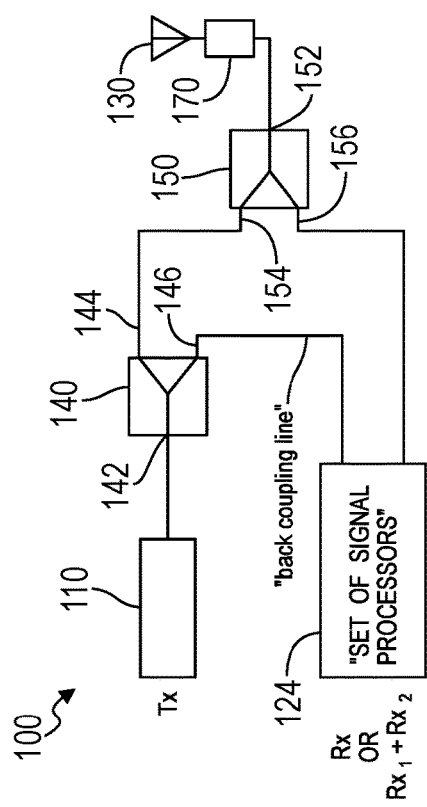
FIG. 1 is a schematic representation of a radio-frequency system.

As shown in FIG. 1, a radio-frequency (hereinafter, "RF") system 100 (hereinafter, "RF system 100") includes: a self-complementary antenna 130 characterized by an input impedance substantially independent of signal frequency across an operational frequency band; a passive coupling device 150 characterized by a characteristic impedance and configured to couple the self-complementary antenna 130 to a signal generator 110 and a set of signal processors 124; a resistive matching network 170 electrically connected between the self-complementary antenna 130 and the passive coupling device 150 configured to match the characteristic impedance of the passive coupling device 150 to the input impedance of the self-complementary antenna 130; and a back-coupling line configured to electromagnetically couple the signal generator 110 to the set of signal processors 124.

Figure 2:
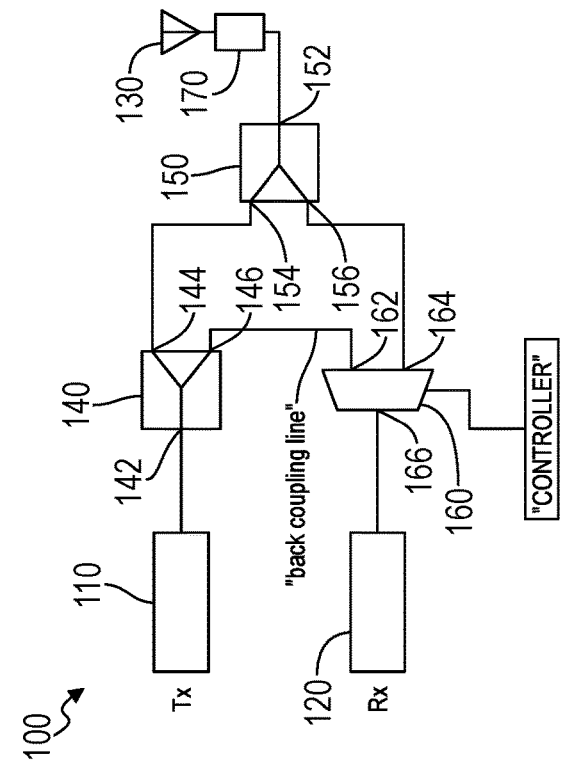
FIG. 2 is a schematic representation of one variation of the radio-frequency system.

As shown in FIG. 2, one implementation of the RF system 100 includes a single signal processor 120 as the set of signal processors 124 and further includes, a multiplexer 160 including: a local reference signal port 162 electrically coupled to the back-coupling line; a receive signal port 164 electrically coupled to the passive coupling device 150; and an output signal port 166 electrically coupled to the signal processor 120. This implementation of the RF system 100 also includes a digital controller electrically coupled to the multiplexer 160 and configured to: select the local reference signal port 162 for output via the output signal port 166 during a transmit slot in a time-division multiple access frame; and select the receive signal port 164 for output via the output signal port 166 during a receive slot in the time-division multiple access frame.

Figure 3:
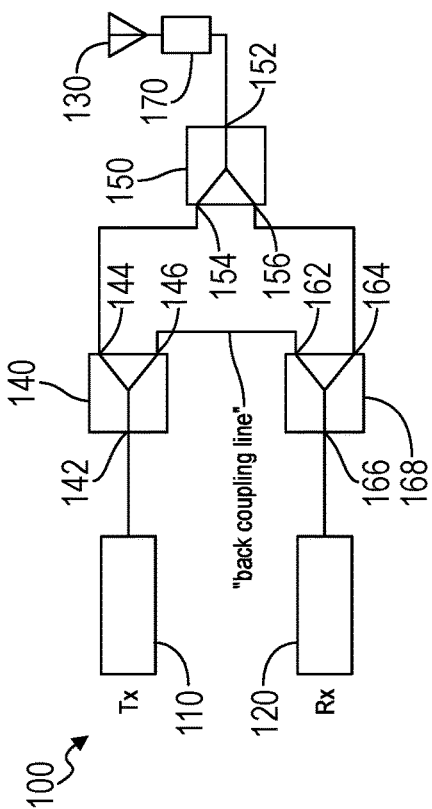
FIG. 3 is a schematic representation of one variation of the radio-frequency system.

As shown in FIG. 3, one implementation of the RF system 100 includes a single signal processor 120 as the set of signal processors 124 and further includes a power combiner 168 including: a local reference signal port 162 electrically coupled to the back-coupling line; a receive signal port 164 electrically coupled to the passive coupling device 150; and an output signal port 166 electrically coupled to the first signal processor 120.

Figure 4:
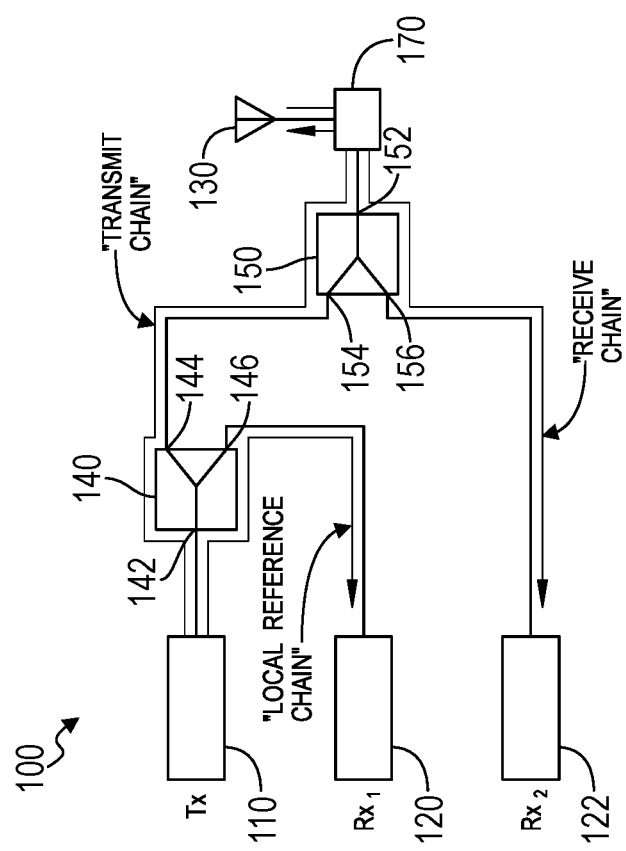
FIG. 4 is a schematic representation of one variation of the radio-frequency system.

As shown in FIG. 4, one implementation of the RF system 100 includes a set of signal processors 124 further including: a first signal processor 120 electrically coupled to the back-coupling line; and a second signal processor 122 electrically coupled to the passive coupling device.

Figure 5:
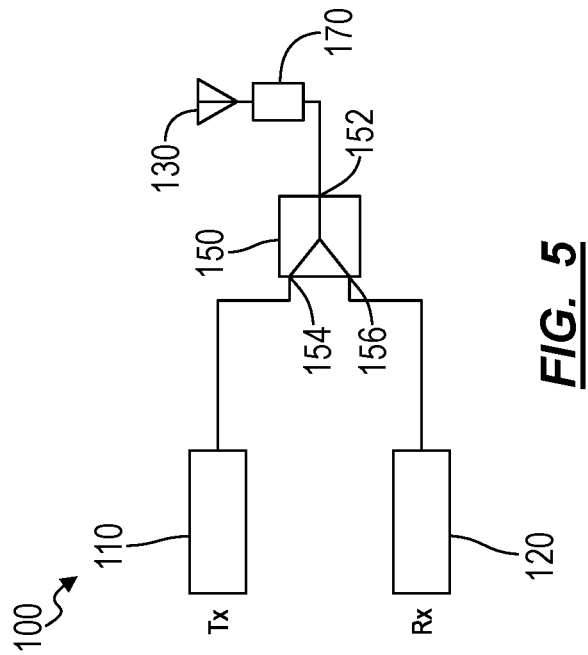
FIG. 5 is a schematic representation of one variation of the radio-frequency system.

As shown in FIG. 5, one variation of the RF system 100 includes: a self-complementary antenna 130 characterized by an input impedance substantially independent of signal frequency; a passive coupling device 150 characterized by a characteristic impedance and configured to couple the self-complementary antenna 130 to a signal generator 110 of the RF system 100 and a signal processor 120 of the RF system 100, the signal processor 120 including an analog-to-digital converter characterized by an input noise floor and an input saturation voltage; a resistive matching network 170 electrically connected between the self-complementary antenna 130 and the passive coupling device 150 configured to reflect a signal, transmitted from the signal generator 110 at a transmit voltage, toward the signal processor 120 at a receive voltage between the input noise floor and the input saturation voltage according to a reflection coefficient effected by a difference between the input impedance and the characteristic impedance.

As shown in FIG. 6, one implementation of this variation of the RF system 100 further includes: a first switch 180 electrically connected between a passive coupling device 140 and the self-complementary antenna 130 in a transmit setting and electrically connected between the self-complementary antenna 130 and a receive line in a receive setting; and a second switch 182 electrically connected between the passive coupling device 140 and the signal processor 120 in the transmit setting and electrically connected between the signal processor 120 and the receive line in the receive setting, the receive line electromagnetically coupling the first switch 180 to the second switch 182 in the receive setting.

As shown in FIG. 7, one implementation of this variation includes: a first splitter 184 electrically connected between the passive coupling device 140 and the self-complementary antenna 130 and electrically connected between the self-complementary antenna 130 and a receive line; a second splitter 186 electrically connected between the passive coupling device 140 and the signal processor 120 and electrically connected between the signal processor 120 and the receive line, the receive line electromagnetically coupling the first splitter 184 to the second splitter 186; a first multiplexer 190 electrically connected between the passive coupling device and the first splitter 184 and configured to pass transmitted signals at a first carrier frequency; and a second multiplexer 191 electrically connected between the first splitter 184 and the second splitter 186 on the receive line and configured to pass receive signals at a second carrier frequency.

As shown in FIG. 8, one implementation of this variation includes: a splitter 192 electrically connected between the signal generator 110 and the passive coupling device 150 configured to split the transmitted signals between the passive coupling device 150 and a recombination line; a variable attenuator 195 arranged on the recombination line configured to attenuate transmitted signals in the recombination line; a power combiner 193 electrically connected between the signal processor 120 and the passive coupling device 150 and configured to combine the transmitted signals in the recombination line with reflected transmitted signals from the passive coupling device 150; and a phase shifter 194 configured to shift the phase of the reflected transmitted signals relative to the transmitted signals from the recombination line to achieve partial cancellation of the reflected transmitted signals to a second signal power greater than the input noise floor and less than an input saturation voltage.

2. Two-Way Ranging System

Figure 12:
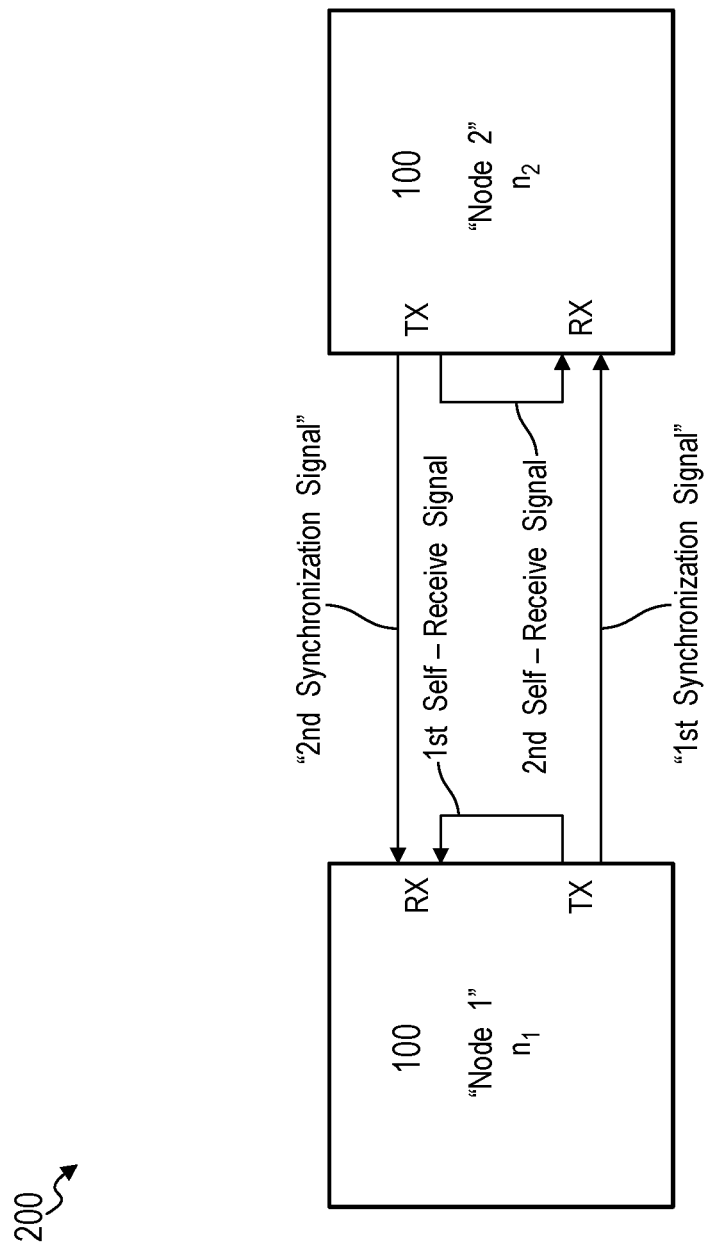
FIG. 12 is a schematic representation of one variation of the two-way ranging system.

As shown in FIG. 12, a two-way ranging system 200 includes: a first RF system 102; and a second RF system 104. The first RF system includes: a first self-complementary antenna 130 characterized by an input impedance substantially independent of signal frequency; a first passive coupling device 150 characterized by a characteristic impedance and configured to couple the first self-complementary antenna 130 to a first signal generator no and a first signal processor 120; and a first recombination line configured to electromagnetically couple the first signal generator 110 to the first signal processor 120. The second RF system includes: a second self-complementary antenna 130 characterized by the input impedance substantially independent of signal frequency; a second passive coupling device 150 characterized by the characteristic impedance and configured to couple the second self-complementary antenna 130 to a second signal generator no and a second signal processor 120; and a second recombination line characterized by a substantially flat group delay and configured to electromagnetically couple the second signal generator no to the second signal processor 120.

3. Applications

Generally, a transceiver coupled to an RF front end, and executing a multiband two-way ranging protocol may introduce a variable, frequency-dependent group delay to a received signal due to changes in the near-field electromagnetic environment of the antenna of the transceiver. Additionally, when generating a local reference signal (e.g., to detect a precise time-of-departure of a transmitted signal), a transceiver may introduce a different frequency-dependent group delay to the local reference signal. Thus, a calculation of propagation delay and/or time bias between transceivers executing this multiband two-way ranging protocol, may exhibit an accuracy limited by the variability in group delay of multiband signals and the variability between signals received via the antenna and local reference signals generated by the transceiver itself.

The RF system 100 includes a self-complementary antenna 130, a resistive matching network 170, and a passive coupling device 140 (e.g., directional coupler, power divider, circulator, etc.) that electrically couples the self-complementary antenna 130 to a signal generator 110 and a set of signal processors 124 (e.g., a first signal processor 120 and/or a second signal processor 122) and is configured to generate a local reference signal (e.g., via reflection of transmitted signals at the antenna interface of the self-complementary antenna 130 or via a back-coupling line between the signal generator 110 and a signal processor 120) in order to reduce frequency-dependent variability in the group delay of received signal and local reference signals. Thus, two (or more) instances of the RF system 100 (hereinafter, "the two-way ranging system") can execute a two-way ranging protocol (such as the protocol described in U.S. patent application Ser. No. 16/405,922) to calculate the propagation time between these RF systems 100 and the time bias between the respective clocks of these RF systems 100 with a greater degree of accuracy (e.g., to within one nanosecond). Additionally, due to the substantially flat group delay characteristics of the RF system 100, calibration for the group delay incurred by received signals and local reference signals at the RF system 100 can be completed more quickly and without separately calibrating for the group delay associated with each frequency band in the bandwidth allocated to the RF system 100.

Figure 11:
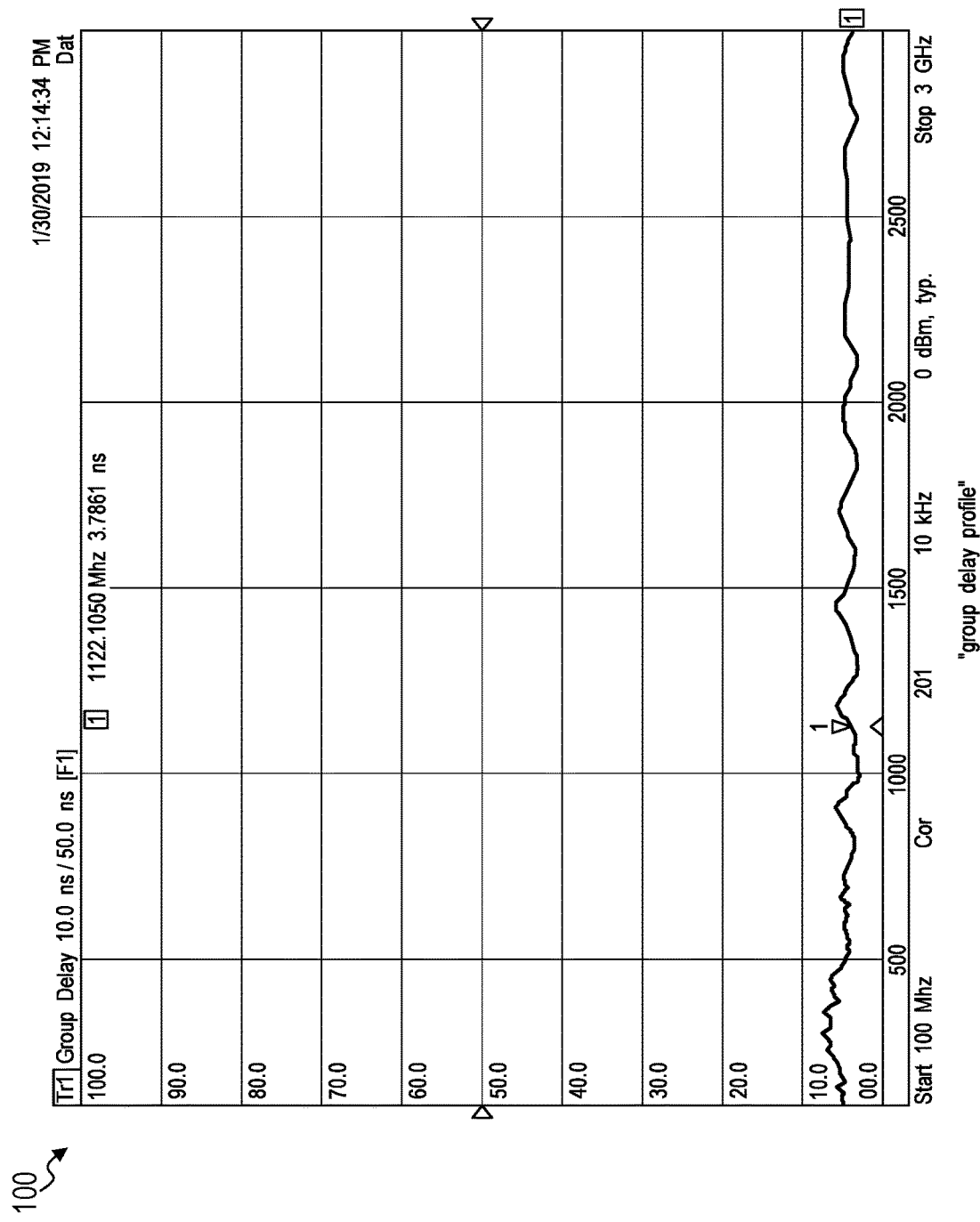
FIG. 11 is a graphical representation of an example group delay measurement for the radio-frequency system.

As shown in FIG. 11, the RF system 100 is characterized by substantially frequency-independent (e.g., maximally flat) group delay for received and self-generated local reference signals irrespective of the near-field electromagnetic environment of the RF system 100, thereby enabling precise comparative timestamping for signals including multiple frequency components, such as synchronization signals in two-way ranging protocols based on carrier phase or time-of-flight measurements. Thus, the RF system 100 can receive signals via the self-complementary antenna 130 and via internal passive coupling devices that have a substantially flat or predictable group delay across a full bandwidth of the RF system 100.

Figure 9:
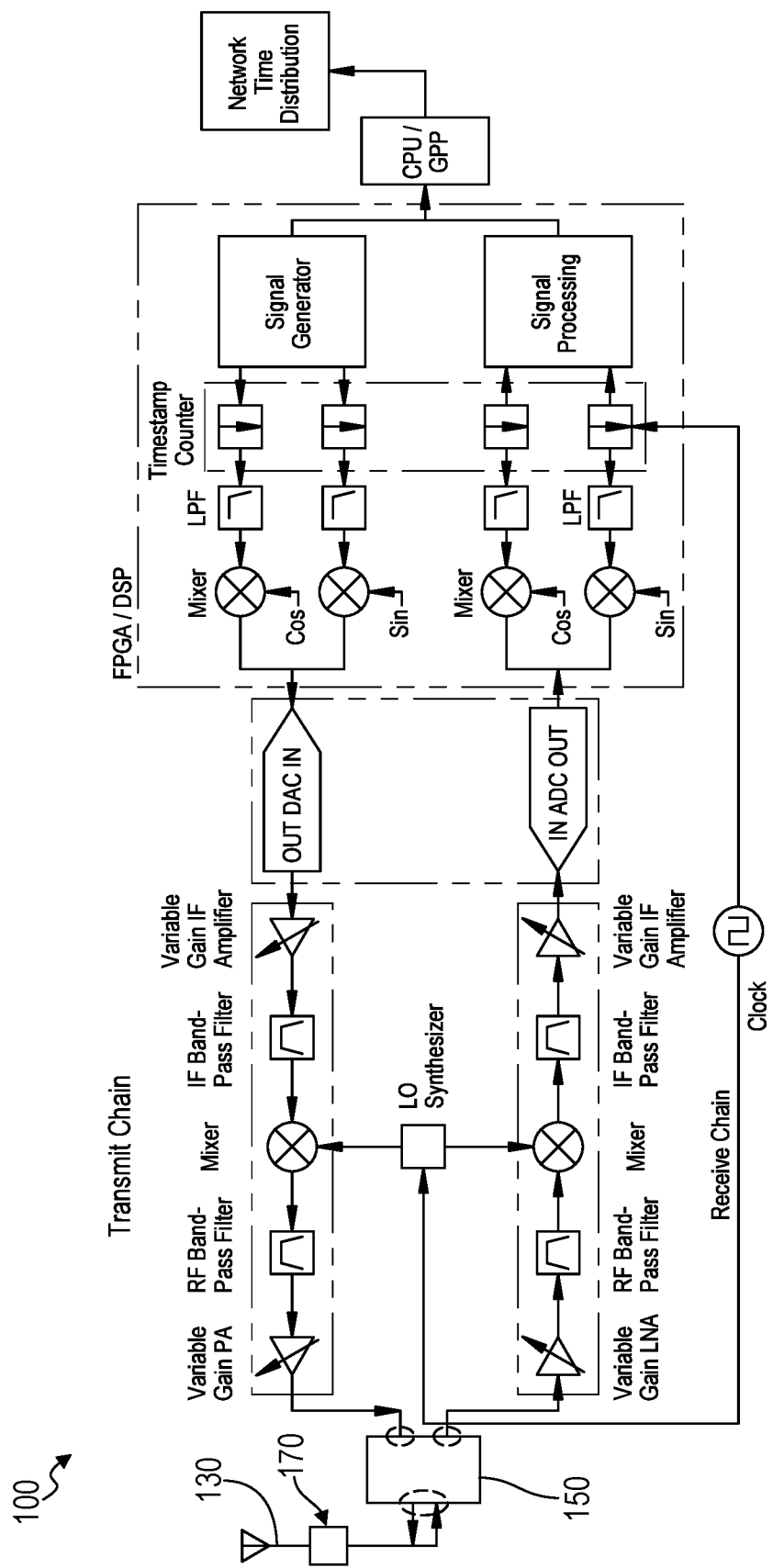
FIG. 9 is a schematic representation of one variation of the radio-frequency system.

The RF system 100 can include standard RF hardware such as a homodyne, heterodyne, or super-heterodyne radio architecture, or other RF front-end architecture such as direct conversion, direct-IF conversion, or zero-IF conversion, shown in FIG. 9. The RF system 100 includes a receive chain and a transmit chain. The receive chain includes a signal processor 120 and a pipeline of hardware components that filter and/or amplify signals received from the receive port of the passive coupling device 140. Additionally, the signal generator 110 of the RF system 100 receives digital signals from the self-complementary via an analog-to-digital converter (hereinafter "ADC"). The transmit chain includes a pipeline of hardware components that process transmission signals generated by the signal generator 110 (i.e. a field-programmable gate array, "FPGA," or digital signal processor, "DSP") and feed them into the transmit port of the passive coupling device 140. In one implementation, the signal generator 110 of the RF system 100 is configured to generate complex digital signals and output the generated signals to a digital-to analog converter (hereinafter, "DAC"). The complex components of the digital signals represent the in-phase and quadrature portions (i.e. I/Q) of the analog signal to be generated by the DAC.

The RF system 100 can include a self-complementary antenna 130 that exhibits maximally flat group delay such that time-of-arrival (hereinafter "TOA") calculated at the RF system 100 for a first signal characterized by a first carrier frequency incurs the same group delay when compared to a TOA calculated for a second signal characterized by a second carrier frequency. The RF system 100 can include a self-complementary antenna 130 characterized by a terminal geometry based on the intended use of the RF system 100 such that the self-complementary antenna 130 generates a target radiation pattern, target signal polarization, and/or target real-valued input impedance. Additionally, the RF system 100 can include a self-complementary antenna 130 with a maximum length dimension corresponding to a largest wavelength of operation for the RF system 100 and/or a feed point dimension corresponding to a smallest wavelength of operation for the RF system 100. In one implementation, the RF system 100 can include a self-complementary antenna 130 with an input impedance close to the characteristic impedance of the passive coupling device 140 and/or the feed line of the antenna.

The RF system 100 also includes a resistive (lossy) impedance matching network in order to match the input impedance of the self-complementary antenna 130 to the characteristic impedance of the passive coupling device 140 and/or the feed line of the antenna without other passive components such as capacitors and inductors, which can introduce additional frequency-dependent group delays and/or exhibit resonance effects via interaction with the near-field electrical environment. Thus, the resistive matching network 170 does not introduce additional group delay to signals received by the RF system 100 or local reference signals generated by the RF system 100.

In one implementation, the RF system 100 can include a resistive matching network 170 configured to generate a local reference signal by reflecting signals transmitted by the RF system 100 at an antenna interface of the self-complementary antenna 130 such that transmitted signals are received at the signal processor 120 of the RF system 100 via the same receive chain as signals received at the self-complementary antenna 130 of the RF system 100.

The RF system 100 also includes a passive coupling device 140, which couples the transmit chain and the receive chain to an antenna port or feed line of the self-complementary antenna 130. The RF system 100 can include a directional coupler, a power divider, a power combiner, or a circulator as the directional coupler. In one implementation, the RF system 100 includes a passive coupling device 140 that reflects (in cooperation with the self-complementary antenna 130) or otherwise back-couples transmitted signals from the transmit chain of the RF system 100 to the receive chain of the RF system 100.

The RF system 100 is configured to execute full-duplex communication, thereby enabling the RF system 100 to receive signals at the self-complementary antenna 130 and local reference signals without interference between these signals. Additionally, the RF system 100 can substantially simultaneously (e.g., within the same frame) receive signals at the self-complementary antenna 130 and receive local reference signals without means for duplex introducing additional frequency-dependent group delays to either the received signals or the local reference signals. In one implementation, the RF system 100 executes time-division duplex (hereinafter "TDD") and includes a switch-based duplex scheme, shown in FIG. 6. In another implementation, the RF system 100 executes a frequency-division duplex (hereinafter "FDD") and includes a diplexer-based duplex scheme, shown in FIG. 7. In yet another variation, the RF system 100 executes either TDD or FDD and includes a self-interference cancellation duplex scheme, shown in FIG. 8. By including any of the above duplex schemes, the RF system 100 can receive local reference signals reflected from the antenna interface as well as signals received at the self-complementary antenna 130 without saturating the ADC of the signal processor 120 or introducing frequency dependent group delays across the full bandwidth of the RF system 100.

Thus, the RF system 100 can increase the accuracy TOA calculations for signals spanning the full operational bandwidth of the RF system 100 due to the flat group delay exhibited by the RF system 100 during execution of a two-way ranging protocol between two instances of the RF system 100.

3.1 Synchronization Example

In one example application, shown in FIG. 12, a two-way ranging system 200 can execute a two-way ranging and time synchronization protocol described in U.S. patent application Ser. No. 16/719,532, U.S. patent application Ser. No. 16/719,545, and U.S. patent application Ser. No. 16/405,922, each of which is incorporated herein by reference. The two-way ranging system 200 includes two instances of the RF system 100 that function and/or a remote computer system in communication with these instances of the RF system 100. These instances of the RF system 100 can function as two nodes in a mesh network of many nodes (e.g., five, ten, 100). Thus, the nodes in the mesh network can execute this two-way ranging and time synchronization protocol on a pairwise basis to characterize the time biases and propagation delays between the nodes in the network. Therefore, this application is described herein with reference to a single pair of nodes but can be extended, on a pairwise basis to an entire mesh network.

A pair of nodes in the two-way ranging system 200 are mutually connected to a computer network (e.g., the Internet or a local area network) such that an initial time bias between any pair of nodes in the mesh network is limited by the network's time synchronization protocol (e.g., network time protocol, or "NTP"). For example, this initial time bias may range from tens of milliseconds to multiple microseconds.

Given this initial coarse clock synchronization between the pair of nodes in the two-way ranging system 200 a first node ($n_1$) transmits a first synchronization signal (e.g., across multiple carrier frequencies) to a second node ($n_2$) in the pair of nodes at the beginning of a synchronization slot according to the local clock of the first node. Likewise, the second node transmits a second synchronization signal to the first node in the pair of nodes at a predetermined time within a synchronization slot according to the local clock of the second node. However, due to the relative time bias between the pair of nodes, the second node may transmit the second synchronization signal to the first node at a time offset from the predetermined time by the time bias between these two nodes.

Upon receiving the second synchronization signal from the second node, the first node calculates a TOA of the second synchronization signal according to the local clock of the first node, such as based on the magnitude, time offset, and/or carrier phase of the autocorrelation peaks associated with preset synchronization codes of the second synchronization signal. Likewise, upon receive the first synchronization signal from the first node, the second node calculates a TOA of the first synchronization signal according to the local clock of the second node. Thus, the two-way ranging system 200 calculates the TOA of the first synchronization signal at the second node according to the local clock of the second node and calculates the TOA of the second synchronization signal at the first node according to the local clock of the first node.

Additionally, while the first node transmits the first synchronization signal to the second node, the first node also reflects and/or back-couples an attenuated repetition of the first synchronization signal (hereinafter a "local reference signal"). The first node then receives this first local reference signal, such as via a receive port of the passive coupling device 140 in the first node. The first node then calculates a TOA for the first local reference signal (according to the local clock of the first node) after the first local reference signal has propagated through the same receiver chain as the second synchronization signal received at the first node. Thus, the first node calculates a TOA of the first local reference signal, which represents a time-of-departure of the first synchronization signal offset by the receiver delay time of the first node. The two-way ranging system 200 can then compare this TOA of the first local reference signal to a TOA of the second synchronization signal at the first node without characterization of the receive chain delay because, when the two-way ranging system 200 subtracts the TOA of the second synchronization signal from the TOA of the first local reference signal, the receive chain delay incurred by both signals cancels out, enabling the transmitting node or computer system to extract an accurate difference between these values.

Likewise, while the second node transmits the second synchronization signal, the second node generates (via reflection or back-coupling) a second local reference signal and calculates a TOA for this second local reference signal according to the local clock of the second node that is similarly offset by the receive chain delay of the second node.

Therefore, upon conclusion of a synchronization slot, the two-way ranging system 200 has recorded: the TOA of the first local reference signal at the first node according to the local clock of the first node; the TOA of the second synchronization signal at the first node according to the local clock of the first node; the TOA of the second local reference signal at the second node according to the local clock of the second node; and the TOA of the first synchronization signal at the second node according to the local clock of the second node. The two-way ranging system 200 can then calculate: a relative clock bias between the first node and the second node and the propagation delay between the pair of nodes based on these recorded TOAs.

More specifically, the two-way ranging system 200 can solve a system of equations based on the reciprocity theorem of electromagnetism and based on an assumption that the receive chain delay (e.g., group delay throughout the receive chain) is consistent (in the frequency and time domain) and/or characterized at the first node and the second node. The relative clock bias between the first node and the second node is then reported to both nodes and one node (i.e. a slave node) can then synchronize its clock to match the other (i.e. a master node).

Additionally, the nodes in the two-way ranging system 200 can transmit a synchronization signal including multiple frequency components across the operational bandwidth of the RF system 100, such that each frequency component of the synchronization signal can include additional phase information with which the two-way ranging system 200 can refine the calculation of the propagation delay and the relative time bias between the first node and the second in order to further increase the accuracy of these values.

Therefore, if the group delays incurred by the synchronization signals or the local reference signals vary based on the carrier frequency of the signals or based whether the signals are local reference signals or synchronization signals, the two-way ranging system 200 may be unable to calculate an accurate time bias or propagation time between the first node and the second node.

Thus, the two-way ranging system 200 includes instances of the RF system 100, which exhibit a group delay profile (e.g., shown in FIG. 11) that is substantially independent of the carrier frequency of synchronization signals and local reference signals, thereby enabling the two-way ranging system 200 to execute the foregoing two-way ranging and time synchronization protocol in less time and/or with greater time accuracy and ranging accuracy. Additionally, because the group delay exhibited by the RF system 100 can be characterized via a single calibration test (e.g., rather than multiple group delay calibration tests across the operational bandwidth of the RF system 100), the RF system 100 can reduce the calibration time—for the group delay incurred by the synchronization signals—for the two-way ranging system.

3.2 Terminology

Generally, the RF system 100 is described herein as exhibiting "substantially" constant group delay or, more specifically, a group delay that is "substantially" independent of signal frequency across an "operational bandwidth" of the RF system 100. In particular, the RF system 100 exhibits a group delay profile, such as shown in FIG. 11, that has a range of less than five nanoseconds across an operational bandwidth of 500 megahertz to 3 gigahertz and a range of less than one nanosecond across an operational bandwidth of 2.25 gigahertz to 2.75 gigahertz (e.g., the 2.5 gigahertz band). In the example implementation of the RF system 100 shown in FIG. 11, the RF system 100 exhibits truncation effects below 500 megahertz due to the finite size of the self-complementary antenna 130 and exhibits some non-idealities within the operational bandwidth due to the geometry of the feed point of the self-complementary antenna 130.

Generally, components of the RF system 100 are described herein as "electrically coupled to" or "electrically connected between" other components of the RF system 100. In particular, these components are coupled such that the RF system 100 can transmit an electromagnetic radio-frequency (hereinafter "RF") signal between these components that incurs negligible unintended distortion, attenuation, or loss of information. Thus, the RF system 100 includes transmission lines or waveguides that couple the components of the RF system 100 to each other and can be specifically designed (with regard to length, impedance, etc.) to transfer RF signals between these components of the RF system 100.

4. Self-Complementary Antenna

The RF system 100 includes a self-complementary antenna 130, which can be characterized by a geometry/structure, a number of terminals, feed point dimensions, and truncation. Generally, a self-complementary antenna 130 exhibits constant impedance across frequency, thereby resulting in constant group delay relative to the frequency of a received signal. This property of self-complementary antenna 130 arises from the duality between magnetic and electric fields for slot and dipole antennas, which follows from Babinet's principle generalized to electromagnetic fields. The following general relationship describes the impedances of slot and dipole antenna structures with dual geometries (i.e., the shapes of the metal structures of a dipole antenna match those of the gap structures of a slot antenna):

$$Z_1 Z_2 = \left(\frac{1}{2} Z_0^2\right),$$

where $Z_0$ is the characteristic impedance of the surrounding free space and $Z_1$ and $Z_2$ are the impedances of each strip or slot structure connected to each of the two terminals of the self-complementary antenna 130. In a self-complementary antenna 130, $Z_1 = Z_2$ and typically $Z_0 \approx 120\pi\Omega$. Thus, the input impedance for a self-complementary antenna 130 with two-terminals is $Z_1 = Z_2 = Z = 60\pi\Omega$. For each additional terminal added to the self-complementary antenna 130, the input impedance of the self-complementary antenna 130 can be further reduced (e.g., for a four terminal self-complementary antenna 130 $Z = 30\pi\sqrt{2}\Omega$. Generally, a self-complementary antenna 130 with n terminals and m order rotational symmetry exhibits:

$$Z_{mn} = \frac{Z_0}{4} \sin\left(\frac{m\pi}{n}\right) \Omega.$$

Therefore, the RF system 100 can include a self-complementary antenna 130 with greater than two terminals in order to set the input impedance of the self-complementary antenna 130 closer to the characteristic impedance of the passive coupling device 140 and/or the feedline of the antenna.

In one implementation, the RF system 100 includes a self-complementary antenna 130 characterized by a "bowtie" geometry, which generates a linearly-polarized and omnidirectional radiation pattern. Thus, the self-complementary antenna 130 can include a bowtie antenna characterized by an input impedance substantially independent of signal frequency across the operational frequency band and configured to radiate a linearly-polarized, omnidirectional radiation pattern.

Alternatively, the RF system 100 includes a self-complementary antenna 130 characterized by a spiral geometry (e.g., logarithmic spiral or arithmetic spiral), which generates a circularly polarized and omnidirectional radiation pattern. Thus, the self-complementary antenna 130 can include an arithmetic spiral antenna characterized by the input impedance substantially independent of signal frequency across the operational frequency band and configured to radiate a circularly polarized omnidirectional radiation pattern.

However, the constant input impedance property of the self-complementary antenna 130 does not change based on the geometry of the terminals, but only depends on the number of terminals and order of rotational symmetry. Therefore, the RF system 100 can include a self-complementary antenna 130 including terminals of any appropriate geometry in order to obtain desired radiation pattern and polarization characteristics.

4.1 Feed Point

The RF system 100 includes a self-complementary antenna 130 that defines a feed point within which the terminals of the self-complementary antenna 130 are arranged (e.g., at the center of the self-complementary structure). The dimensions of the feed point define a lower bound on the effective bandwidth of the antenna. Therefore, the RF system 100 includes a self-complementary antenna 130 with feed point dimensions that are a small fraction of the shortest wavelength (highest frequency) within the intended bandwidth of the self-complementary antenna 130.

4.2 Truncation

Although the theoretical properties of the self-complementary antenna 130 are fully realized with a planar self-complementary antenna 130 of infinite extent, in order to practically function within the RF system 100, the self-complementary antenna 130 is truncated. The point at which the self-complementary antenna 130 is truncated defines the largest dimension of the self-complementary antenna 130, which therefore dictates the longest wavelength that the self-complementary antenna 130 can receive. Truncation of the antenna also results in a radiation resistance and corresponding antenna efficiency that is lower than the ideal value for the infinite self-complementary structure (e.g., $Z_0 \approx 120\pi\Omega$ for a two-terminal antenna).

5. Resistive Matching Network

Figure 10A:
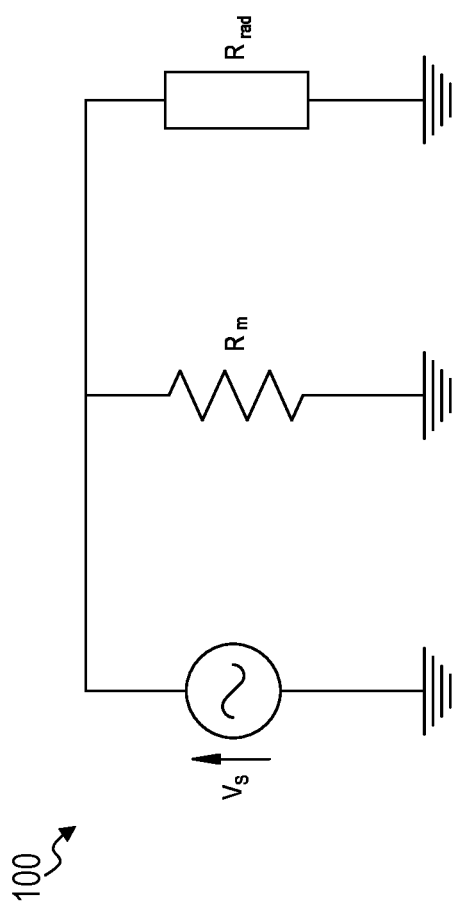
FIG. 10A is a schematic representation of one variation of the radio-frequency system.

The RF system 100 also includes a resistive matching network 170 configured to match the input impedance of the self-complementary antenna 130 to the characteristic impedance of the passive coupling device 140 and/or the feedline of the antenna, while maintaining a frequency-independent group delay for the antenna. Alternatively, the RF system 100 can include a resistive matching network 170 that adjusts the input impedance of the self-complementary antenna 130 in order to reflect transmitted signals from the transmit chain toward the receive chain to generate a local reference signal. Although the RF system 100 can include any resistive matching network 170 such as sets of resistors in series or in parallel with the self-complementary antenna 130, in one implementation, the RF system 100 includes a single matched shunt resistor in parallel with the self-complementary antenna 130, as shown in FIG. 10A.

Figure 10B:
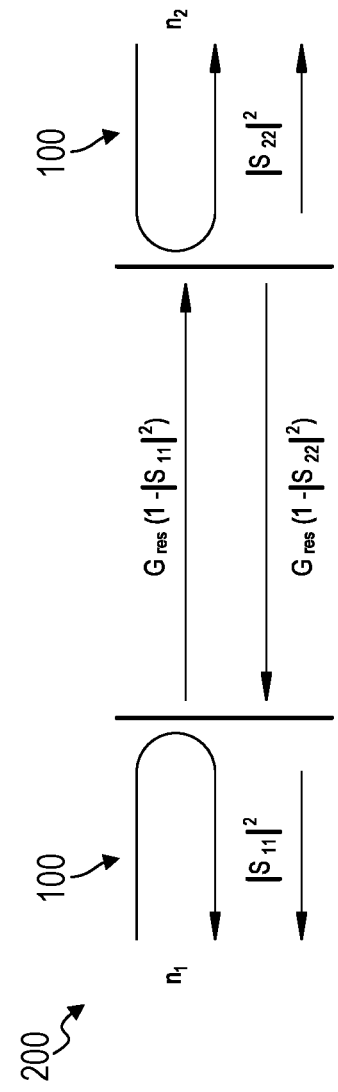
FIG. 10B is a schematic representations of one variation of the two-way ranging system.

In this implementation, the RF system 100 includes a shunt resistor of resistance $R_m$ to match the constant radiation resistance, $R_{rad}$, of the self-complementary antenna 130. The RF system 100 accounts for the free-space link between two nodes (which are instances of the RF system 100) operating a two-way ranging and synchronization scheme based on carrier phase or time-of-flight measurements requiring a local reference signal, which may be provided by but is not limited to simultaneous reflectometry from the antenna-transmitter interface, as shown in FIG. 10B. Thus, the ratio of back-reflected power from the antenna interface to incident power from the transmit chain is given by the magnitude of the complex reflection coefficient squared:

$$\frac{P_{r,1}}{P_{s,1}} = |S_{11}|^2,$$

wherein $$S_{11} = \frac{Z_L - Z_0}{Z_L + Z_0},$$

wherein $Z_0$ is the characteristic impedance of the passive coupling device 140 and $Z_L$ is the matched impedance of the antenna and resistive matching network 170.

Thus, the forward-transmitted power from a first node (integrating the radiation pattern from the antenna over the total surface area of a unit sphere, $4\pi$ steradians) is given by:

$$P_{t,1} = G_{res}(1-|S_{11}|^2)$$

wherein $G_{res}$ is the fraction of power radiated by the self-complementary antenna 130. Via the equivalent circuit model, an equation for the current in the shunt resistor, $I_1$, and the current in the self-complementary antenna 130, $I_2$, is as follows:

$$I_1 = I_2 \frac{R_{rad}}{R_m}.$$

According to the above relation, the RMS power dissipated in the matching resistor, $P_1$, and the RMS power radiated by the antenna, $P_2$, can be calculated as follows:

$$P_1 = \frac{1}{2}I_1^2 R_m = \frac{1}{2}I_2^2 \frac{R_{rad}^2}{R_m},$$

$$P_2 = \frac{1}{2}I_2^2 R_{rad}.$$

The total incident power is, therefore, $P_s = P_1 + P_2$. Thus, the fraction of power radiated by the antenna is:

$$G_{res} = \frac{P_2}{P_1 + P_2} = \frac{1}{1 + \frac{P_1}{P_2}},$$

$$G_{res}(dB) = -10\log_{10}\left(1 + \frac{R_{rad}}{R_m}\right).$$

Thus, maximizing the forward-transmitted power, $P_2$, as a function of $R_m$ is equivalent to matching $Z_L$ to $Z_0$, with the ideal result:

$$Z_L = \frac{R_{rad} R_m}{R_{rad} + R_m} \approx 68\Omega.$$

Practically, the RF system 100 can include a shunt resistor with a resistance value that may differ from the ideal value due to a lower radiation resistance for the antenna from its truncation. More specifically, the RF system 100 can include resistive matching network 170 with a shunt resister characterized by a shunt resistance configured to match the characteristic impedance of the passive coupling device 140 to the input impedance of the self-complementary antenna 130. The reactance of the antenna feed point may also result in non-ideal matching. Additionally, in order to induce a reflection within the RF system 100, the RF system 100 can include a matching network for a non-ideal $Z_L$ (from the perspective of forward transmitted power), as further described in U.S. patent application Ser. No. 16/719,532 and U.S. patent application Ser. No. 16/719,545.

6. Passive Coupling Device

The RF system 100 can include an assembly of the passive coupling device 140 and the resistive matching network 170, which together can generate the local reference signal by generating reflection at the antenna interface of the self-complementary antenna 130. More specifically, the passive coupling device 140 can include a transmit port electrically coupled to the transmit chain, a receive port electrically coupled to the receive chain, and the antenna port electrically coupled to the self-complementary antenna 130. In addition to routing the local reference signal from the transmit port to the receive port, the passive coupling device 140 enables the RF system 100 to use one antenna (or I/O port) for both transmitting and receiving functions. Therefore, the passive coupling device 140 also functions to transmit signals from the transmit port to the antenna port and from the antenna port to the receive port. Thus, the RF system 100 can include any device that may satisfy the above constraints, such as a directional coupler, a power divider, a circulator, or any other transmission line coupling device.

The passive coupling device 140 is characterized by a characteristic impedance, which, in a standard RF implementation, may be 50Ω or 75Ω.

In one implementation, the passive coupling device 140 is a directional coupler. A typical directional coupler has four ports referred to as the input port, the through port, the coupled port, and the isolated port, wherein the input port and the through port are connected directly via a first transmission line and the isolated port and the coupled port are connected by a second transmission line loosely coupled to the first transmission line. Thus, RF power transmitted in the first transmission line from the input port to the through port is also transferred to the coupled port. However, RF power is not transmitted from the isolated port, which is terminated with the characteristic impedance of the transmission line and dissipates RF power in a resistor with corresponding impedance value. When integrated with the RF system 100, the input port of the directional coupler can function as the antenna port and can be connected to the matching network and antenna. The through port can function as the transmit port and the coupled port can function as the receive port. The isolated port in this implementation can be terminated with the characteristic impedance of the directional coupler. Thus, any signals received at the antenna are coupled to the receive port and any reflected signals at the antenna port are back-coupled to the receive port.

Because the directional coupler does not couple signals at full power, any signal coupled between the antenna port and the receive port may be attenuated according to the coupling factor of the directional coupler. As such, in implementations where the RF system 100 is capable of increased transmit power, the RF system 100 can include a directional coupler where the receive port is located on the same transmission line as the antenna port and the transmit port is located on the coupled transmission line. Thus, the power of the transmitted signal is attenuated according to the coupling factor of the directional coupler before being transmitted and/or reflected at the antenna port.

Additionally, the RF system 100 can include a directional coupler with multiple coupling sections, wherein each coupling section is optimized for a different frequency band. The coupling factor of each coupling section can also be adjusted to adjust the gain at a particular frequency band.

In another implementation, the RF system 100 includes a power divider acting as the passive coupling device 140. In this implementation, the transmit port and the receive port are located at each of the divided ports of the power divider while the antenna port is located at the input port of the power divider. Because the power divider splits power more evenly between the transmit port and the receive port the local reference signal can be received with a potentially higher power in this implementation.

In yet another implementation, the RF system 100 includes a circulator acting as the passive coupling device 140. The circulator can include the transmit port at a first port, the antenna port at a second port, and the receive port at the third port. The circulator can be further configured to deliver power directly from the transmit port to the antenna port, and from the antenna port to the receive port. Additionally, any reflection from the antenna port interface will reflect from the antenna port to the receive port.

In some implementations, the RF system 100 can include other electrical components interposed between ports of the passive coupling device 140 and the antenna for the purpose of enabling full-duplex communication between instances of the RF system 100.

7. Direct Back-Coupling Variation

In one variation, shown in FIG. 1, the RF system 100 can generate a local reference signal by directly back-coupling a transmitted signal from the signal generator 110 or transmit chain to the signal processor 120 or receive chain such that, for each signal transmitted by the RF system 100, the signal processor 120 of the RF system 100 receives a copy of the signal at the signal processor 120, thereby enabling the RF system 100 to calculate a time-of-departure of the transmitted signal. The RF system 100 can be configured according to various implementation described below in order to directly back-couple a local reference signal while preventing the local reference signal from incurring frequency dependent group delay.

7.1 Single Signal Processor Variation

Generally, in the variations shown in FIGS. 2 and 3, the RF system 100 includes one signal processor 120 for both the local reference chain and the receive chain. More specifically, the RF system 100 can include: a self-complementary antenna 130 electrically coupled to a second passive coupling device 150, the second passive coupling device 150 defining a coupled port 156 that is electrically coupled to the first signal processor 120. In particular, the RF system 100 can include a multiplexer 160 or power combiner 168 that couples both the local reference chain (via the first passive coupling device 140) and the receive chain (via the second passive coupling device 150) to the single signal processor 120 of the RF system 100. This variation of the RF system 100 reduces unit costs by including only a single signal processor 120 at the expense of protocol complexity (e.g., to prevent interference of between a simultaneously received local reference signal and a signal received via the self-complementary antenna 130).

7.1.1 Multiplexer and Digital Controller Variation

Generally, in the single signal processor 120 variation shown in FIG. 2, the RF system 100 can include a multiplexer 160 coupled to a digital controller—such as an FPGA or digital signal processor 120—to actively switch between the local reference chain and the receive chain of the RF system 100 to receive both local reference signals and receive signals respectively. More specifically, the RF system 100 can include: a multiplexer 160; and a digital controller electrically coupled to the multiplexer 160 and configured to: select the local reference signal port 162 during a transmit slot in a TDMA frame; and select the receive signal port 164 during a receive slot in the TDMA frame. Thus, in this implementation, the RF system 100 is configured to transmit signals and concurrently generate local reference signals during a first slot of a TDMA frame and receive signals from other instances of the RF system 100 during subsequent slots of a TDMA frame.

Furthermore, the RF system 100 can include a local reference chain: electromagnetically coupling the signal generator 110 to the signal processor 120 via the first passive coupling device 140 and the multiplexer 160 and configured to back-couple a transmitted signal from the signal generator 110 for reception at the signal processor 120 as a local reference signal during the transmit slot in the time-division multiple access frame; and a receive chain: electromagnetically coupling the self-complementary antenna 130 to the signal processor 120 via the second passive coupling device 150 and the multiplexer 160 and configured to couple a signal received at the self-complementary antenna 130 for reception at the signal processor 120 during the receive slot in the time-division multiple access frame.

7.1.2 Power Combiner Variation

Generally, in the single signal processor 120 variation shown in FIG. 3, the RF system 100 can include a power combiner 168 such that the RF system 100 can concurrently receive a local reference signal and a receive signal (e.g., via a frequency division multiple access protocol). More specifically, the RF system 100 can include a power combiner 168: defining a local reference signal port 162 electrically coupled to the coupled port 146 of the first passive coupling device 140; defining a receive signal port 164 electrically coupled to the coupled port 156 of the second passive coupling device 150; and defining a combined port 166 electrically coupled to the signal processor 120. Thus, the power combiner 168 can merge the local reference chain and the receive chain into the signal processor 120 to enable the RF system 100 to generate local reference signals and perform transceiving functions with a single signal processor 120.

7.2 Double Signal Processor Variation

Generally, in the variation of the RF system 100 including a set of two signal processor 120s (shown in FIG. 4), the RF system 100 can include a first signal processor 120 in the set of signal processors 124 electrically coupled to a coupled port 146 of the first passive coupling device 140 and a second signal processor 122 electrically coupled to the a second coupled port 156 of the second passive coupling device 140. More specifically, the first signal processor 120 can receive and process local reference signals back-coupled by the first passive coupling device 140. Thus, the first signal processor 120 can function to receive local reference signals at the termination of the local reference chain of the RF system 100.

In one implementation, the first signal processor 120 can include an ADC characterized by a narrow range and high-resolution in comparison to a second signal processor 122 in the set of signal processors 124 because the RF system 100 can tightly control the signal strength of the local reference signal at the signal generator 110 or at a variable attenuator interposed between the first passive coupling device 140 and the first signal processor 120.

Generally, the RF system 100 includes a second passive coupling device 150—such as a directional coupler or power divider—electromagnetically connecting the transmit chain to the self-complementary antenna 130 and the self-complementary antenna 130 to the receive chain. More specifically, the RF system 100 includes a second passive coupling device 150: defining an input port 152 electrically coupled to the self-complementary antenna 130; defining a transmitted port 154 electrically coupled to the transmitted port 144 of the first passive coupling device 140; defining a second coupled port 156 electrically coupled to the second signal processor 122; and characterized by a second phase balance between the transmitted port 154 and the coupled port 156 substantially similar to the first phase balance and a second group delay substantially similar to the group delay of the first passive coupling device 140. Thus, the second passive coupling device 150 enables the RF system 100 to use one self-complementary antenna 130 (or I/O port) for both transmitting and receiving functions. Therefore, the passive coupling device 140 also functions to transmit signals from the signal generator 110 to the self-complementary antenna 130 and from the self-complementary antenna 130 to a signal processor 120. Thus, the RF system 100 can include any device that may satisfy the above constraints, such as a directional coupler, a power divider, a circulator, or any other transmission line coupling device. However, in order to maintain similarities in phase balance and group delay to the first passive coupling device 140, the RF system 100 can include a second passive coupling device 150 that is the same type of coupling device (or the exact same component) as the first coupling device. By including a first passive coupling device 140 and a second passive coupling device 150 with similar characteristics, the RF system 100 can ensure that the local reference chain and the receive chain impart a similar time delay and phase shift to signals propagating through these chains.

In one example, where the RF system 100 includes a first power divider as the first passive coupling device 140, the RF system 100 can also include a second power divider as the second passive coupling device 150. In another example, where the RF system 100 includes a first directional coupler as the first passive coupling device 140, the RF system 100 also includes a second directional coupler as the second passive coupling device 150.

In one implementation, the RF system 100 includes a second passive coupling device 150 that electromagnetically couples the self-complementary antenna 130 to a signal processor 120 of the RF system 100 via the same port configuration of the first passive coupling device 140 that electromagnetically couples the signal generator 110 to the signal processor 120. For example, the RF system 100 can include the first passive coupling device 140 defining an input port 142 electrically coupled to the signal generator 110 and a coupled port 144 electrically coupled to the signal processor 120 for the local reference chain. Therefore, in this example, the RF system 100 also includes the second passive coupling device 150, which includes an input port 152 electrically coupled to the self-complementary antenna 130 and a coupled port 156 electrically coupled to the signal processor 120 for the receive chain.

Generally, as shown in FIG. 4, the RF system 100 includes a second signal processor 122 configured to process signals received at the self-complementary antenna 130 of the RF system 100. More specifically, the RF system 100 includes: the self-complementary antenna 130 electrically coupled to an input port 152 of the second passive coupling device 150, the second passive coupling device 150 defining a coupled port 156 that is electrically coupled to a second signal processor 122 in the set of signal processor 120s 124. Thus, when the RF system 100 receives signals at the self-complementary antenna 130, they are propagated through the second passive coupling device 150 to a second signal processor 122. The RF system 100 can also include a set of filters, low-noise amplifiers 190, or other analog components to condition the signal received from the self-complementary antenna 130 for digital signal processing.

In one implementation, the RF system 100 can include a second signal processor 122 that further includes an ADC with a wider range and lower resolution when compared to the first signal processor 120, such that the RF system 100 can receive signals from other instances of the RF system 100 with a larger variation in SNR when compared to the local reference signal generated by the RF system 100.

8. Full-Duplex Communication

Generally, the RF system 100 is configured to execute full-duplex communication. Because the RF system 100 executes a two-way ranging/synchronization scheme based on carrier phase or time-of-flight measurements, the RF system 100 includes a means for duplex communication between instances of the RF system 100 (e.g., as nodes in a wireless network) that does not introduce additional frequency-dependent group delays and prevents saturation of the ADC in the receive chain of the RF system 100 due to simultaneous reception of a reflected reference signal and a signal received from another RF device at the antenna. In one variation, the RF system 100 executes TDD and includes a switched-based duplex scheme. In another variation, the RF system 100 executes FDD and includes a diplexer-based duplex scheme. In yet another variation, the RF system 100 executes either TDD or FDD and includes a self-interference cancellation duplex scheme. All of the above duplex schemes ensure that reflected local reference signals and received signals can be received without saturation of the ADC in the receive chain while also exhibiting substantially constant group delay across the operational bandwidth of the RF system 100.

8.1 Switch-Based Duplexer

As shown in FIG. 6, the RF system 100 can include a switch-based duplexer configuration, wherein a first switch 180 is electrically connected between the passive coupling device 140 and the self-complementary antenna 130 and electrically connected between the self-complementary antenna 130 and a receive line; and a second switch 182 electrically connected between the passive coupling device 140 and the receive chain setting and electrically connected between the receive chain and the receive line. The receive line electrically couples one port of the first switch 180 to the second switch 182 in the receive setting. The RF system 100 can also include a controller or processor that is configured to alternate the first and second switch 182 between a transmit setting and a receive setting according to corresponding frames of a TDD scheme. Thus, during a transmit frame of a TDD scheme the controller sets the first switch 180 and the second switch 182 to a transmit setting and during a receive frame the controller sets the first switch 180 and the second switch 182 to a receive setting.

In the transmit setting, the RF system 100, via the controller, can set the switches to electrically couple the self-complementary antenna 130 to the passive coupling device 140 using the first switch 180 and to electrically couple the passive coupling device 140 to the receive chain using the second switch 182. Thus, signals transmitted to the self-complementary antenna 130 via the passive coupling device 140 are reflected, as described above, to the receive chain, provided a reflected reference signal for the outgoing transmitted signal.

In the receive setting, the first switch 180 electrically couples the self-complementary antenna 130 to a receive line. The second switch 182 electrically couples the receive chain to the receive line. Thus, in the receive setting, the switches provide a direct connection between the self-complementary antenna 130 and the receive chain.

Thus, the RF system 100 can execute a TDD scheme to receive incoming signals from other RF devices during the allotted TDD frames while also receiving a reflected reference signal in accordance with the two-ranging protocol based on simultaneous reflectometry from the antenna-transmitter interface without saturating the ADC in the receive chain of the RF system 100. In one implementation, the RF system 100 can include attenuators between the passive coupling device 140 and the receive chain. Therefore, the RF system 100 can transmit synchronization signals at a higher power via gain control in the DAC of the transmit chain without saturating the ADC with the reflected local reference signal.

8.2 Diplexer-Based Duplexer

As shown in FIG. 7, the RF system 100 can also include a diplexer-based duplexer configuration, wherein a first splitter 184 is electrically connected between the passive coupling device 140 and the self-complementary antenna 130 and electrically connected between the self-complementary antenna 130 and a receive line; a second splitter 186 is electrically connected between the passive coupling device 140 and the receive chain and electrically connected between the receive chain and the receive line, the receive line electrically coupling the first splitter 184 to the second splitter 186; a first multiplexer electrically connected between the passive coupling device 140 and the first splitter 184 and configured to pass transmitted signals at a first carrier frequency; and a second multiplexer electrically connected between the first splitter 184 and the second splitter 186 on the receive line and configured to pass receive signals at a second carrier frequency.

Thus, the RF system 100 can transmit and receive simultaneously by multiplexing the transmit signal (and therefore the reflected local reference signal) at a different carrier frequency relative to incoming signals. A controller of the RF system 100 can then compensate for any frequency dependent group delay caused by the multiplexers via calibration of the analog components in the transmit chain of the RF system 100. More specifically, the RF system 100 can include: a first multiplexer 190 characterized by a first frequency-dependent group delay corresponding to the first carrier frequency; a second multiplexer 191 characterized by a second frequency-dependent group delay corresponding to the second carrier frequency; and a controller configured to compensate for the first frequency-dependent group delay and the second frequency-dependent group delay.

8.3 Self-Interference Cancellation Duplexer

As shown in FIG. 8, the RF system 100 can include: a self-interference cancellation duplexer configuration, wherein a splitter 192 is electrically connected between the transmit chain and the passive coupling device 150 and is configured to split the transmitted signals between the passive coupling device 150 and a recombination line; a variable attenuator 195 arranged on the recombination line and configured to attenuate transmitted signals in the recombination line; a power combiner 193 electrically connected between the receive chain and the passive coupling device 150 and configured to combine the transmitted signal in the recombination line with the local reference signal reflected from the antenna interface; and a phase shifter 194 configured to shift the phase of the local reference signal relative to the transmitted signal from the recombination line to achieve partial cancellation of the local reference signal to a second signal power greater than the input noise floor and less than an input saturation voltage.

In this implementation, the RF system 100 splits off a portion of the transmitted signal via the first splitter 192, thereby passing the signal through the variable attenuator 195 on the recombination line. At substantially the same time, another portion of the transmitted signal (i.e. the local reference signal) is reflected at the interface between the passive coupling device 150 and the self-complementary antenna 130. The phase shifter 194 shifts the phases of the local reference signal relative to the portion of the signal on the recombination line before the power combiner 193 combines the back-reflected local reference signal from the antenna interface/passive coupling device 150 with the attenuated version from the recombination line. According to the above configuration, the RF system 100 can be tuned to cause the two versions of the transmitted signal to destructively interfere, thereby reducing signal power incident to the receive chain of the RF system 100 and preventing saturation of the ADC.

In one implementation, the RF system 100 includes a phase shifter 194 implemented as an antenna feedline characterized by a specific length thereby increasing the time required for a transmitted signal to reflect from the interface of the self-complementary antenna 130 and the feedline and imparting a phase delay on the reflected local reference signal relative to the signal on the recombination line. Thus, the RF system 100 can include a feedline of length:

$$l = \frac{\phi}{k},$$

where k is the wavenumber corresponding to the carrier frequency of the transmitted signal. In order for the RF system 100 to maintain consistent or predictable group delay the group delay imparted to the transmitted signal due to the increased length of the feedline can be characterized as follows:

$$\tau = 2l/c,$$

where τ is the round-trip group delay for the reflected local reference signal and c is the speed of light. Furthermore, the RF system 100 can include variable feedline lengths, wherein each feedline length corresponds to a different carrier frequency of operation. Thus, the RF system 100 can include an antenna feedline, as a phase shifter 194, interposed between the passive coupling device 150 and the self-complementary antenna 130 and configured to shift the phase of the reflected transmitted signals relative to the transmitted signals from the recombination line to achieve partial cancellation of the reflected transmitted signals to the second signal power greater than the input noise floor and less than the input saturation voltage.

Implementations of the RF system 100 including a self-interference cancellation duplexer with a single recombination line can achieve up to approximately 20 dB of attenuation, thereby enabling the RF system 100 to transmit signals at a power 20 dB higher without saturating the ADC in the receive chain with the reflected local reference signal and without disrupting the constant group delay characteristic of the RF system 100 (assuming the DSP of the RF system 100 corrects for any systematic group delay offsets caused by the phase shifter 194 or other passive/active components).

In one implementation, the RF system 100 can also include an isolator 196 to prevent received signals from the antenna from detuning the signal generator 110.

The systems and methods described herein can be embodied and/or implemented at least in part as a machine configured to receive a computer-readable medium storing computer-readable instructions. The instructions can be executed by computer-executable components integrated with the application, applet, host, server, network, website, communication service, communication interface, hardware/firmware/software elements of a user computer or mobile device, wristband, smartphone, or any suitable combination thereof. Other systems and methods of the embodiment can be embodied and/or implemented at least in part as a machine configured to receive a computer-readable medium storing computer-readable instructions. The instructions can be executed by computer-executable components integrated by computer-executable components integrated with apparatuses and networks of the type described above. The computer-readable medium can be stored on any suitable computer readable media such as RAMs, ROMs, flash memory, EEPROMs, optical devices (CD or DVD), hard drives, floppy drives, or any suitable device. The computer-executable component can be a processor but any suitable dedicated hardware device can (alternatively or additionally) execute the instructions.

As a person skilled in the art will recognize from the previous detailed description and from the figures and claims, modifications and changes can be made to the embodiments of the invention without departing from the scope of this invention as defined in the following claims.

We claim:

1. A radio-frequency system comprising:
a self-complementary antenna characterized by an input impedance substantially independent of signal frequency across an operational frequency band;
a passive coupling device characterized by a characteristic impedance and configured to couple the self-complementary antenna to a signal generator and a set of signal processors;
a resistive matching network electrically connected between the self-complementary antenna and the passive coupling device and configured to match the characteristic impedance of the passive coupling device to the input impedance of the self-complementary antenna; and
a back-coupling line configured to electromagnetically couple the signal generator to the set of signal processors.

2. The radio-frequency system of claim 1, further comprising a receive chain comprising the self-complementary antenna, the resistive matching network, the passive coupling device, and a first signal processor in the set of signal processors, the receive chain exhibiting a group delay profile characterized by a range of less than one nanosecond across the operational frequency band.

3. The radio-frequency system of claim 1:
wherein the set of signal processors comprises a first signal processor; and
further comprising:
a multiplexer comprising:
a local reference signal port electrically coupled to the back-coupling line;
a receive signal port electrically coupled to the passive coupling device; and
an output signal port electrically coupled to the first signal processor; and
a digital controller electrically coupled to the multiplexer and configured to:
select the local reference signal port for output via the output signal port during a transmit slot in a time-division multiple access frame; and
select the receive signal port for output via the output signal port during a receive slot in the time-division multiple access frame.

4. The radio-frequency system of claim 1:
wherein the set of signal processors comprises a first signal processor; and
further comprising a power combiner comprising:
a local reference signal port electrically coupled to the back-coupling line;
a receive signal port electrically coupled to the passive coupling device; and
an output signal port electrically coupled to the first signal processor.

5. The radio-frequency system of the claim 1, wherein the set of signal processors comprises:
a first signal processor electrically coupled to the back-coupling line; and
a second signal processor electrically coupled to the passive coupling device.

6. The radio-frequency system of claim 5, further comprising:
a receive chain:
comprising the self-complementary antenna, the resistive matching network, the passive coupling device, and the first signal processor; and
exhibiting a first substantially constant group delay across the operational frequency band; and
a local reference chain:
comprising the signal generator, the back-coupling line, and the second signal processor; and
exhibiting a second substantially constant group delay across the operational frequency band.

7. The radio-frequency system of the claim 1, wherein the resistive matching network comprises a shunt resister characterized by a shunt resistance configured to match the characteristic impedance of the passive coupling device to the input impedance of the self-complementary antenna.

8. The radio-frequency system of claim 1, wherein the self-complementary antenna comprises a bowtie antenna characterized by the input impedance substantially independent of signal frequency across the operational frequency band and configured to radiate a linearly-polarized, omnidirectional radiation pattern.

9. The radio-frequency system of claim 1, wherein the self-complementary antenna comprises an arithmetic spiral antenna characterized by the input impedance substantially independent of signal frequency across the operational frequency band and configured to radiate a circularly polarized omnidirectional radiation pattern.

10. A radio-frequency system comprising:
a self-complementary antenna characterized by an input impedance substantially independent of signal frequency;
a passive coupling device characterized by a characteristic impedance and configured to couple the self-complementary antenna to a signal generator of a radio-frequency system and a signal processor of the radio-frequency system, the signal processor comprising an analog-to-digital converter characterized by an input noise floor and an input saturation voltage;

a resistive matching network electrically connected between the self-complementary antenna and the passive coupling device configured to reflect a signal, transmitted from the signal generator at a transmit voltage, toward the signal processor at a receive voltage between the input noise floor and the input saturation voltage according to a reflection coefficient effected by a difference between the input impedance and the characteristic impedance.

11. The radio-frequency system of claim 10, further comprising:

a first switch electrically connected between the passive coupling device and the self-complementary antenna in a transmit setting and electrically connected between the self-complementary antenna and a receive line in a receive setting; and a second switch electrically connected between the passive coupling device and the signal processor in the transmit setting and electrically connected between the signal processor and the receive line in the receive setting, the receive line electromagnetically coupling the first switch to the second switch in the receive setting.

12. The radio-frequency system of claim 11, further comprising a controller configured to:

set the first switch to the transmit setting and the second switch to the transmit setting during a transmit frame of a time-division duplex scheme; and set the first switch to the receive setting and the second switch to the receive setting during a receive frame of the time-division duplex scheme.

13. The radio-frequency system of claim 10, further comprising:

a first splitter electrically connected between the passive coupling device and the self-complementary antenna and electrically connected between the self-complementary antenna and a receive line;

a second splitter electrically connected between the passive coupling device and the signal processor and electrically connected between the signal processor and the receive line, the receive line electromagnetically coupling the first splitter to the second splitter;

a first multiplexer electrically connected between the passive coupling device and the first splitter and configured to pass a transmitted signal at a first carrier frequency; and a second multiplexer electrically connected between the first splitter and the second splitter on the receive line and configured to pass a received signal at a second carrier frequency.

14. The radio-frequency system of claim 13:

wherein the first multiplexer is characterized by a first frequency-dependent group delay corresponding to the first carrier frequency;

wherein the second multiplexer is characterized by a second frequency-dependent group delay corresponding to the second carrier frequency; and further comprising a controller configured to compensate for the first frequency-dependent group delay and the second frequency-dependent group delay.

15. The radio-frequency system of claim 10, further comprising:

a splitter electrically connected between the signal generator and the passive coupling device configured to split a transmitted signal between the passive coupling device and a recombination line;

a variable attenuator arranged on the recombination line configured to attenuate the transmitted signal in the recombination line;

a power combiner electrically connected between the signal processor and the passive coupling device and configured to combine the transmitted signal in the recombination line with a reflection of the transmitted signal from the passive coupling device in the receive line; and a phase shifter configured to shift a phase of the reflection of the transmitted signal in the receive line relative to the transmitted signal in the recombination line to destructively interfere with the reflection of the transmitted signal in the receive line to generate a local reference signal, the local reference signal characterized by a second signal power greater than the input noise floor and less than an input saturation voltage.

16. The radio-frequency system of claim 15, wherein the phase shifter comprises an antenna feedline interposed between the passive coupling device and the self-complementary antenna and configured to shift the phase of the reflection of the transmitted signal in the receive line relative to the transmitted signal in the recombination line to destructively interfere with the transmitted signal in the recombination line to generate the local reference signal characterized by the second signal power.

17. A two-way ranging system comprising:

a first radio-frequency system comprising:

a first self-complementary antenna characterized by an input impedance substantially independent of signal frequency;

a first passive coupling device characterized by a characteristic impedance and configured to couple the first self-complementary antenna to a first signal generator and a first signal processor; and a first recombination line configured to electromagnetically couple the first signal generator to the first signal processor; and a second radio-frequency system comprising:

a second self-complementary antenna characterized by the input impedance substantially independent of signal frequency;

a second passive coupling device characterized by the characteristic impedance and configured to couple the second self-complementary antenna to a second signal generator and a second signal processor; and a second recombination line configured to electromagnetically couple the second signal generator to the second signal processor.

18. The two-way ranging system of claim 17:

wherein the first radio-frequency system comprises a first resistive matching network:

electrically connected between the first self-complementary antenna and the first passive coupling device; and configured to reflect signals, transmitted from the first signal generator at a first transmit voltage, toward the first signal processor at a first receive voltage between a first input noise floor of the first signal processor and a first input saturation voltage of the first signal processor according to a reflection coefficient effected by a difference between the input impedance and the characteristic impedance; and wherein the second radio-frequency system comprises a second resistive matching network:

electrically connected between the second self-complementary antenna and the second passive coupling device; and configured to reflect signals, transmitted from the second signal generator at a second transmit voltage, toward the second signal processor at a second receive voltage between a second input noise floor of the second signal processor and a second input saturation voltage of the second signal processor according to the reflection coefficient effected by the difference between the input impedance and the characteristic impedance.

19. The two-way ranging system of claim 17:
wherein the first radio-frequency system is configured to:
   transmit a first synchronization signal via the first self-complementary antenna;
   receive a first local reference signal for the first synchronization signal at the first signal processor; and
   receive a second synchronization signal at the first signal processor via the first self-complementary antenna; and wherein the second radio-frequency system is configured to:
   transmit the second synchronization signal via the second self-complementary antenna;
   receive a second local reference signal for the second synchronization signal at the second signal processor; and
   receive the first synchronization signal at the second signal processor via the second self-complementary antenna.

20. The two-way ranging system of claim 19, wherein the first radio-frequency system is configured to calculate a propagation time and a time bias between the first radio-frequency system and the second radio-frequency system based on a first time-of-arrival of the first local reference signal at the first radio-frequency system, a second time-of-arrival of the first synchronization signal at the second radio-frequency system, a third time-of-arrival of the second local reference signal at the second radio-frequency system, and a fourth time-of-arrival of the second synchronization signal at the first radio-frequency system.

* * * * *